US012812757B2

(12) United States Patent
Hahto et al.

(10) Patent No.: US 12,812,757 B2
(45) Date of Patent: Nov. 24, 2026

(54) ION SOURCE AND ION IMPLANTER HAVING ION SOURCE

(71) Applicant: NISSIN ION EQUIPMENT CO., LTD., Koka-city (JP)

(72) Inventors: Sami K. Hahto, Nashua, NH (US); George Sacco, Groveland, MA (US)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 53 days.

(21) Appl. No.: 18/621,274

(22) Filed: Mar. 29, 2024

(65) Prior Publication Data

US 2025/0308833 A1 Oct. 2, 2025

(51) Int. Cl.

*H05H 1/42* (2006.01)
*H01J 27/08* (2006.01)
*H01J 37/08* (2006.01)
*H01J 37/317* (2006.01)
*H01J 37/32* (2006.01)
*H01J 49/10* (2006.01)

(52) U.S. Cl.

CPC ............... *H05H 1/42* (2013.01); *H01J 27/08* (2013.01); *H01J 37/08* (2013.01); *H01J 37/3171* (2013.01); *H01J 37/3244* (2013.01); *H01J 37/32467* (2013.01); *H01J 37/32522* (2013.01); *H01J 49/105* (2013.01)

(58) Field of Classification Search

None

See application file for complete search history.

(56) References Cited

U.S. PATENT DOCUMENTS 2,709,222 A * 5/1955 Lawrence .............. B01D 59/48 250/284
4,719,355 A * 1/1988 Meyers ................. H01J 27/022 250/425
5,998,798 A * 12/1999 Halling ............... H01J 37/3171 250/252.1
6,627,901 B2 * 9/2003 Martinez ................. H01J 37/08 250/427
7,107,929 B2 * 9/2006 Horsky ............... H01J 37/3171 118/723 CB
7,659,505 B2 * 2/2010 Jolliffe .................... H01J 49/10 250/281
8,044,348 B2 * 10/2011 Jolliffe .................... H01J 49/24 250/288
8,502,161 B2 * 8/2013 Hahto ................... H01J 27/205 250/424
8,759,788 B1 * 6/2014 Bassom .................. H01J 27/08 315/111.21
10,153,134 B1 * 12/2018 Hahto ................. H01J 37/3244
10,777,397 B2 * 9/2020 Takáts ................... H01J 49/049

(Continued)

FOREIGN PATENT DOCUMENTS

CN 105719927 A * 6/2016 .......... H01J 37/3053
WO WO-2023147108 A1 * 8/2023 .......... H01J 37/3171

*Primary Examiner* — Srinivas Sathiraju
(74) *Attorney, Agent, or Firm* — Sughrue Mion, PLLC

(57) ABSTRACT

An ion source includes a vaporizer that produces a vapor from a solid raw material, and a plenum including a plenum chamber having a first wall through which the vaporizer is in fluid communication with an interior of the plenum chamber, and a second wall opposite the first wall. The second wall includes a plenum plate with a longitudinal aperture therein.

20 Claims, 16 Drawing Sheets

(56) References Cited

U.S. PATENT DOCUMENTS

| | | | | |
|---|---|---|---|---|
| 11,587,778 | B2 * | 2/2023 | Likhanskii | H01J 49/105 |
| 11,728,140 | B1 * | 8/2023 | Bassom | H01J 37/32412<br>250/492.21 |
| 11,769,648 | B2 * | 9/2023 | McLaughlin | H01J 37/08<br>250/492.3 |
| 12,112,915 | B2 * | 10/2024 | Hahto | H01J 37/08 |
| 12,328,807 | B2 * | 6/2025 | Sacco | H01J 27/02 |
| 2003/0230986 | A1 * | 12/2003 | Horsky | H01J 37/3171<br>315/111.81 |
| 2004/0104682 | A1 * | 6/2004 | Horsky | H01J 27/205<br>315/111.81 |
| 2006/0144332 | A1 * | 7/2006 | Sweeney | C23C 16/4486<br>118/726 |
| 2007/0107841 | A1 * | 5/2007 | Horsky | H01J 27/205<br>156/345.4 |
| 2007/0278417 | A1 * | 12/2007 | Horsky | H01J 27/205<br>250/427 |
| 2008/0230713 | A1 * | 9/2008 | Huang | H01J 37/3171<br>250/426 |
| 2009/0183679 | A1 * | 7/2009 | McIntyre | H01J 37/08<br>118/723 CB |
| 2009/0194687 | A1 * | 8/2009 | Jolliffe | H01J 49/10<br>250/288 |
| 2009/0294698 | A1 * | 12/2009 | Ray | H01J 37/3171<br>250/492.21 |
| 2010/0171033 | A1 * | 7/2010 | Jolliffe | H01J 49/10<br>250/288 |
| 2010/0320395 | A1 * | 12/2010 | Hahto | H01J 37/08<br>250/426 |
| 2012/0252195 | A1 * | 10/2012 | Jones | H01J 37/08<br>257/E21.334 |
| 2014/0342538 | A1 * | 11/2014 | Jones | H01J 37/08<br>438/530 |
| 2018/0138020 | A1 * | 5/2018 | Koo | H01J 37/32458 |
| 2020/0051773 | A1 * | 2/2020 | Chaney | H01J 37/08 |
| 2020/0083015 | A1 * | 3/2020 | Sweeney | H01J 37/08 |
| 2020/0388468 | A1 * | 12/2020 | Sporleder | H01J 37/32504 |
| 2021/0366690 | A1 * | 11/2021 | Lin | H01J 37/3171 |
| 2022/0139691 | A1 * | 5/2022 | Likhanskii | H01J 27/16<br>250/288 |
| 2023/0133101 | A1 * | 5/2023 | McLaughlin | H01J 27/02<br>250/492.3 |
| 2023/0135525 | A1 * | 5/2023 | Colvin | H01J 37/08<br>250/492.21 |
| 2023/0245859 | A1 * | 8/2023 | Bassom | H01J 27/08<br>250/492.21 |
| 2023/0326702 | A1 * | 10/2023 | Hahto | H01J 37/08<br>250/423 R |
| 2023/0352265 | A1 * | 11/2023 | Colvin | H01J 37/08 |
| 2024/0098869 | A1 * | 3/2024 | Sacco | H01J 27/02 |
| 2025/0266231 | A1 * | 8/2025 | Hahto | H01J 27/02 |
| 2025/0308833 | A1 * | 10/2025 | Hahto | H01J 27/02 |

* cited by examiner

ION SOURCE AND ION IMPLANTER HAVING ION SOURCE

BACKGROUND

The present disclosure relates to an ion source and, in particular, an ion source having a plenum chamber and plenum plate with longitudinal aperture, and an ion implanter having the same.

Ion sources generate a plasma from which an ion beam is extracted. The extracted ion beam is then directed onto a target, e.g., a wafer, in order to implant various ions into the target to dope the target with the ions.

The ion beam may be a spot beam or a ribbon ion beam. A spot beam has an elliptical cross-section when the ion beam is cut in a plane perpendicular to a traveling direction of the ion beam. A ribbon beam has a rectangular cross-section (i.e., a vertical length that is greater than a horizontal length) when the ion beam is cut in a plane perpendicular to the traveling direction of the ion beam. In either case, it is advantageous for the ion source to produce a plasma from which a uniform ion beam may be extracted to efficiently implant the ions into the target.

SUMMARY

It is an aspect to provide a ion source which achieves improved uniformity of the plasma when generating a ribbon ion beam.

According to an aspect of one or more embodiments, there is provided a ion source comprising a vaporizer configured to produce a vapor, and a plenum comprising a plenum chamber having a first wall through which the vaporizer is in fluid communication with an interior of the plenum chamber, and a second wall opposite the first wall, the second wall comprising a plenum plate with a longitudinal aperture therein.

According to another aspect of one or more embodiments, there is provided an ion source comprising a vaporizer comprising a nozzle; a plenum comprising a plenum chamber having a first wall through which the nozzle of the vaporizer extends and a second wall opposite the first wall, the second wall comprising a plenum plate with a longitudinal aperture therein, and a plurality of gas feed chambers coupled to a plurality of gas feed lines; and an ionization chamber which is in fluid communication with both to the plenum chamber through the longitudinal aperture and to the plurality of gas feed chambers.

According to yet another aspect of one or more embodiments, there is provided an ion implanter comprising a process chamber including a target holder; the ion source; and a plurality of extraction electrodes configured to extract an ion beam from the ion source to implant ions on a target removably disposed on the target holder.

BRIEF DESCRIPTION OF THE DRAWINGS

The above and/or other aspects will become apparent and more readily appreciated from the following description of various embodiments, taken in conjunction with the accompanying drawings, in which:

FIGS. 3-5 illustrate a ion source, according to some embodiments, in which FIG. 3 illustrates the ion source when viewed from a Z-axis direction, FIG. 4 illustrates a cross-sectional view of the ion source taken along A-A' in FIG. 3, and FIG. 5 illustrates a cross-sectional view of the ion source taken along B-B' in FIG. 3;

FIGS. 6-8 illustrate a ion source, according to some embodiments, in which FIG. 6 illustrates the ion source when viewed from a Z-axis direction, FIG. 7 illustrates a cross-sectional view of the ion source taken along A-A' in FIG. 6, and FIG. 8 illustrates a cross-sectional view of the ion source taken along B-B' in FIG. 6;

FIGS. 11-13 illustrate a liner of the ion source, according to some embodiments, in which FIG. 11 illustrates the liner when the ion source is viewed from a Z-axis direction in FIG. 2, FIG. 12 illustrates a cross-sectional view of the liner taken along A-A' in FIG. 11, and FIG. 13 illustrates a cross-sectional view of the liner taken along B-B' in FIG. 11; and FIGS. 14-16 illustrate a liner of the ion source, according to some embodiments, in which FIG. 14 illustrates the liner when the ion source is viewed from a Z-axis direction in FIG. 2, FIG. 15 illustrates a cross-sectional view of the liner taken along A-A' in FIG. 14, and FIG. 16 illustrates a cross-sectional view of the liner taken along B-B' in FIG. 14.

DETAILED DESCRIPTION

In a related art ion source, one or more gases and/or vapors are injected into a plasma chamber of the ion source to generate the plasma inside the plasma chamber. In a related art technology, a plenum is used to generally distribute the gas or vapor throughout an arc chamber. However, the plenum in the related art technology is used to distribute gases or vapor to produce an efficient reaction with a filament, and does not take into account properties of the ion beam. For example, the related art technology does not take into account differences between plasma generated to produce a spot beam verses a ribbon ion beam. In particular, in the case of a ribbon ion beam, it is advantageous for the one or more gases and/or vapors to be uniformly dispersed longitudinally within a plasma chamber so that a plasma density is uniform in a longitudinal direction within the plasma chamber in order to be able to extract a consistent ribbon ion beam to effectively dope the target.

Figure 1:
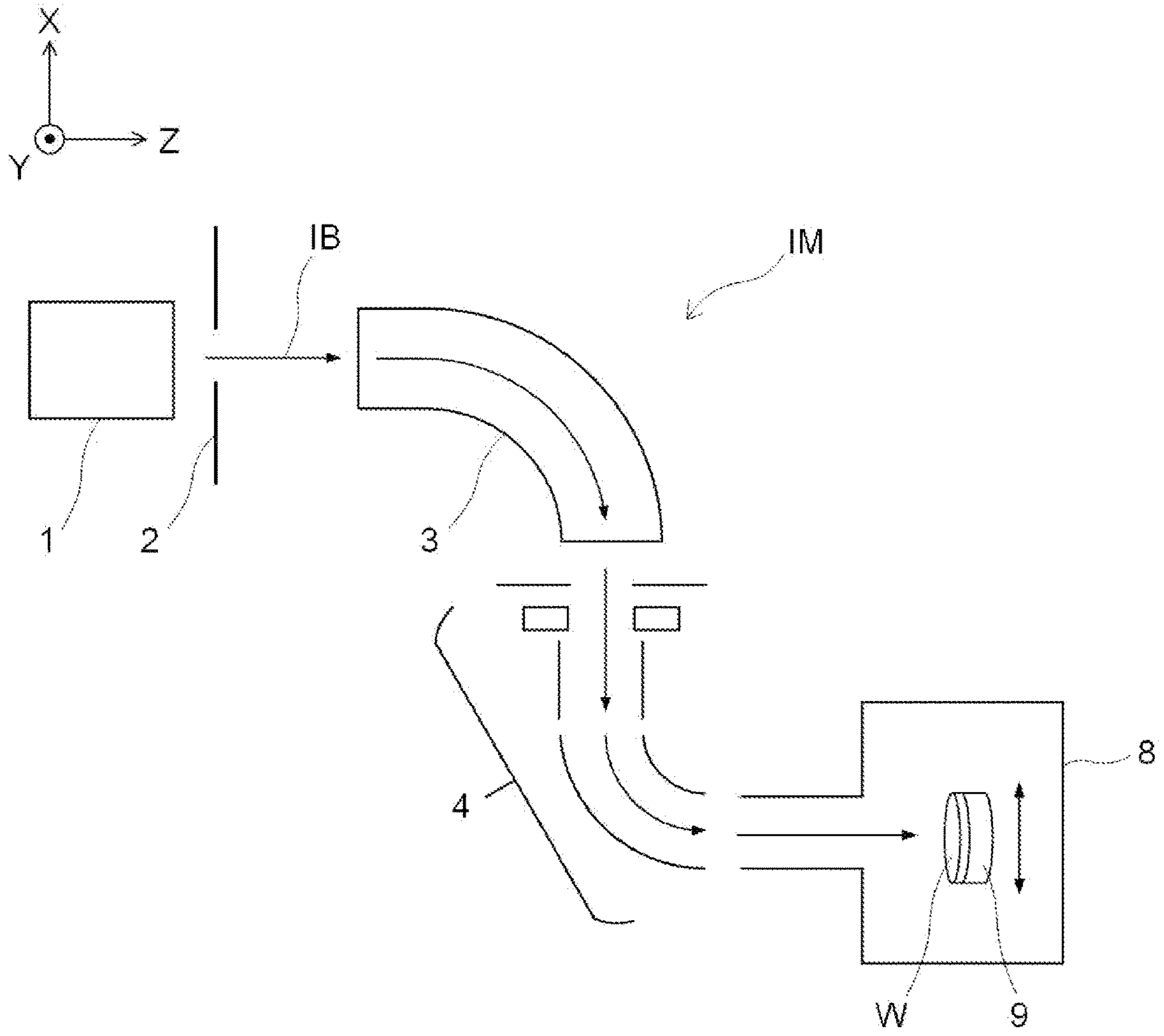
FIG. 1 is a schematic plan view of an example of an ion implanter, according to some embodiments.

FIG. 1 is a schematic plan view of an example of an ion implanter IM, according to some embodiments. The ion implanter IM illustrates an example of a use case of the ion source. The ion implanter IM is only an example and, in some embodiments, the ion source may be used in any device requiring ion generation.

In an embodiment, the ion implanter IM may include a ion source 1, one or more extraction electrodes 2, a mass analyzer 3, an E-bend device 4, a process chamber 8, and a wafer holder 9. However, these components are only an example and, in some embodiments, a greater or lesser number of components may be included in the ion implanter IM.

In an embodiment, the ion source 1 may be an indirect hot cathode (IHC) ion source. However, embodiments are not limited thereto and, in some embodiments, other types of ion source may be used. In the description that follows, the ion source 1 is described under the assumption that ion source 1 is an IHC ion source. The ion source 1 generates plasma, which is a source of an ion beam IB. The one or more extraction electrodes 2 extract the ion beam IB from the plasma generated in the ion source 1. In some embodiments, the one or more extraction electrodes 2 may include a plurality of extraction electrodes 2.

The ion beam IB extracted from the extraction electrode 2 contains a plurality of ions. The mass analyzer 3, which is an electromagnet, selects the ions according to their mass to extract desired ions from the ion beam IB. The E-bend device 4 accelerates or decelerates and bends the ion beam IB including ions selected by mass analyzer 3 to convert the ion beam IB into an ion beam IB having a desired energy.

The ion beam IB having the desired energy is then irradiated onto a wafer W that is held by a wafer holder 9. By moving the wafer holder 9 (and thus the wafer W) across the ion beam IB, an ion implantation process may be carried out on the wafer W.

The wafer W held by the wafer holder 9 is placed in the process chamber 8. A drive device (not illustrated) is connected to the wafer holder 9. The drive device may adjust a posture of the wafer holder 9 with respect to the ion beam IB to adjust an irradiation angle of the ion beam IB with respect to the wafer W.

The XYZ axes shown in FIG. 1 are drawn such that the Z axis is parallel to the traveling direction of the ion beam IB; the X and Y axes are mutually orthogonal to the Z axis. The direction of each of the XYZ axes for any individual component varies according to an orientation of a component with respect to the ion beam being transported as illustrated in FIG. 1.

Figure 2:
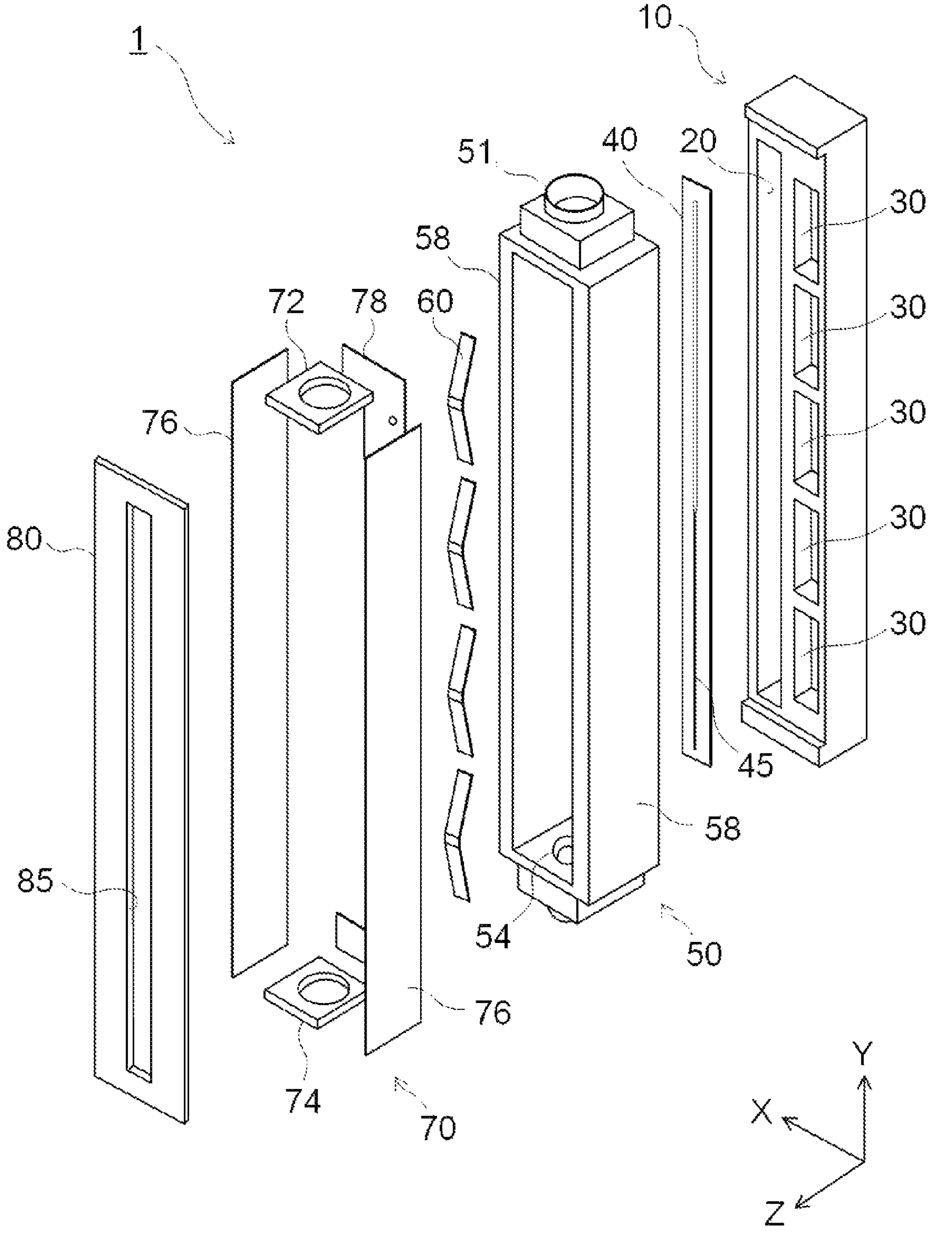
FIG. 2 illustrates an exploded perspective view of an example of a ion source of the ion implanter, according to some embodiments.

FIG. 2 illustrates an exploded perspective view of an example of a ion source of the ion implanter, according to some embodiments.

In an embodiment, the ion source 1 may include a plenum 10 and an ionization chamber 50. The plenum 10 may include a plenum chamber 20, a plurality of gas feed chambers 30, and a plenum plate 40. The plenum chamber 20 is rectangular, having a long side in a vertical direction (e.g., a Y-axis direction) and a short side in a horizontal direction (e.g., a X-axis direction). In other words, the plenum chamber 20 may be a longitudinal chamber having a width in the X-axis direction and height in the Y-axis direction that is greater than the width. In an embodiment, the plenum chamber 20 includes a plurality of walls that, along with the plenum plate 40, define the plenum chamber 20. In an embodiment, the plenum chamber 20 has an opening in a distal side thereof and the opening is covered by the plenum plate 40. The plenum plate 40 has a slit 45 therein. The slit 45 is long in the vertical direction (e.g., the Y-axis direction) and narrow in the horizontal direction (e.g., the X-axis direction) and thus forms a longitudinal aperture in the plenum plate 40. Examples of the slit 45 are described in more detail below.

The plurality of gas feed chambers 30 are formed adjacent to the plenum chamber 20. In an embodiment, the plurality of gas feed chambers 30 are spaced apart from each other in the vertical direction (e.g., the Y-axis direction). In an embodiment, each of the gas feed chambers 30 may be generally rectangular, having a long side in a vertical direction (e.g., a Y-axis direction) and a short side in a horizontal direction (e.g., a X-axis direction). Each of the gas feed chambers 30 may have an opening in a distal end thereof, similar to the plenum chamber 20. In an embodiment, a surface in which the openings of the plurality of gas feed chambers 30 may be formed may be coplanar with the plenum plate 40. In an embodiment, a surface in which the openings of the plurality of gas feed chambers 30 are provided may be coplanar with a surface in which the opening of the plenum chamber 20 is provided.

The embodiment of FIG. 2 shows the plenum 10 as formed from a single block. However, in some embodiments, the plenum 10 may be formed in two separate blocks and the two separate blocks may be fixed together. In other words, the plenum chamber 20 may be formed in a first block and the plurality of gas feed chambers 30 may be formed in a second block, and the first and second blocks may be secured together side-by-side. However, it is advantageous to form the plenum 10 from a single block in terms of decreased manufacturing cost and decreased complexity.

In an embodiment, each of the plenum 10 and the plenum plate 40 may be made of carbon. However, this is only an example and, in other embodiments, each of the plenum 10 and the plenum plate 40 may be made of graphite or other materials.

In an embodiment, the ionization chamber 50 may include a top wall 51 including a top hole for receiving a cathode 52 and a filament 53 (see FIG. 4), a bottom wall 54 including a bottom hole for receiving a cathode 55 and a filament 56 (see FIG. 4), and two side walls 58 that connect the top wall to the bottom wall. The front and the back of the ionization chamber 50 in a third direction (e.g., a Z-axis direction), which is a traveling direction of an ion beam that is extracted from the ion source 1, are open. The ionization chamber 50 is rectangular, having a long side in a vertical direction (e.g., a Y-axis direction) and a short side in a horizontal direction (e.g., a X-axis direction). In other words, similar to the plenum chamber 20, the ionization chamber 50 may be a longitudinal chamber having a width in the X-axis direction and height in the Y-axis direction that is greater than the width. It is noted that the cathode 52 and the filament 53 are described as being received in the top hole of the ionization chamber 50 and the cathode 55 and filament 56 are described as being received in the bottom hole of the ionization chamber 50 in FIG. 1. However, this is only an example and, in some embodiments, the positions of the cathode 52 and the filament 53, and the cathode 55 and the filament 56 may be changed.

The ionization chamber 50 is secured to the plenum 10 at a proximal end of the ionization chamber 50 and a distal end of the ionization chamber 50 is covered by an extraction plate 80. In other words, the back of the ionization chamber 50 is secured to the plenum 10 such that an interior of the plenum chamber 20 is in fluid communication with an interior of the ionization chamber 50 and such that an interior of each of the plurality of gas feed chambers 30 is in fluid communication with the interior of the ionization chamber 50. The front of the ionization chamber 50 is covered by the extraction plate 80. The extraction plate 80 has an extraction aperture 85 therein. The extraction aperture 85 is long in the vertical direction (e.g., the Y-axis direction) and narrow in the horizontal direction (e.g., the X-axis direction) and thus forms a longitudinal aperture in the extraction plate 80. In an embodiment, the extraction aperture 85 has a uniform width along the vertical direction (e.g., Y-axis direction) thereof.

In some embodiments, interior walls of the ionization chamber 50 may be covered by a liner 70. In some embodiments, the liner 70 may include a plurality of liners. The plurality of liners may include a top liner 72, a bottom liner 74, and two side wall liners 76, which correspond respectively to the top wall 51, bottom wall 54, and two side walls 58 of the ionization chamber 50, and a rear liner 78. The rear liner 78 is formed with an opening corresponding to the slit 45 in the plenum plate 40 and openings corresponding to the plurality of gas feed chambers 30. In some embodiments, the plurality of liners may further include a front liner that is formed with an opening corresponding to the extraction aperture 85 in the extraction plate 80. Examples of the liner 70 will be described in more detail below.

In an embodiment, the liner 70 may be held in place by a spring 60. In an embodiment, the spring 60 may include a plurality of leaf springs as illustrated in the example of FIG. 1. However, this is only an example and, in some embodiments, the spring 60 may include a plurality of coil springs.

In some embodiments, the liner 70 may be omitted.

In use, the plenum chamber 20 receives a vapor from a single point source and provides a space for the vapor to spread out evenly along the height of the ion source 1. In other words, the vapor may broaden and diverge in a longitudinal direction (e.g., a Y-axis direction) within the plenum chamber 20. The plenum plate 40 restricts the flow of vapor from the single point source. The shape of the slit 45 is a longitudinal aperture and is used to produce vertical uniformity of the flow of the vapor into the ionization chamber 50. Each of the plurality of gas feed chambers 30 receives a gas from one or more of a plurality of gas feed lines 35 (not illustrated in FIG. 2) and allows the received gas to spread out before entering the ionization chamber 50. In the ionization chamber 50, a plasma based on the vapor and the gases is generated and the ion beam IB is extracted by the extraction electrodes 2 outside the extraction plate 80 of the ionization chamber 50. The liner 70 prevents sputtering of a plasma generated in the ionization chamber 50 onto the walls of the ionization chamber 50, and thus may increase the time needed between cleanings of the ionization chamber 50, thus saving maintenance costs. In some embodiments, the liner 70 may prevent reaction of the plasma with the walls of the ionization chamber 50.

Figure 3:
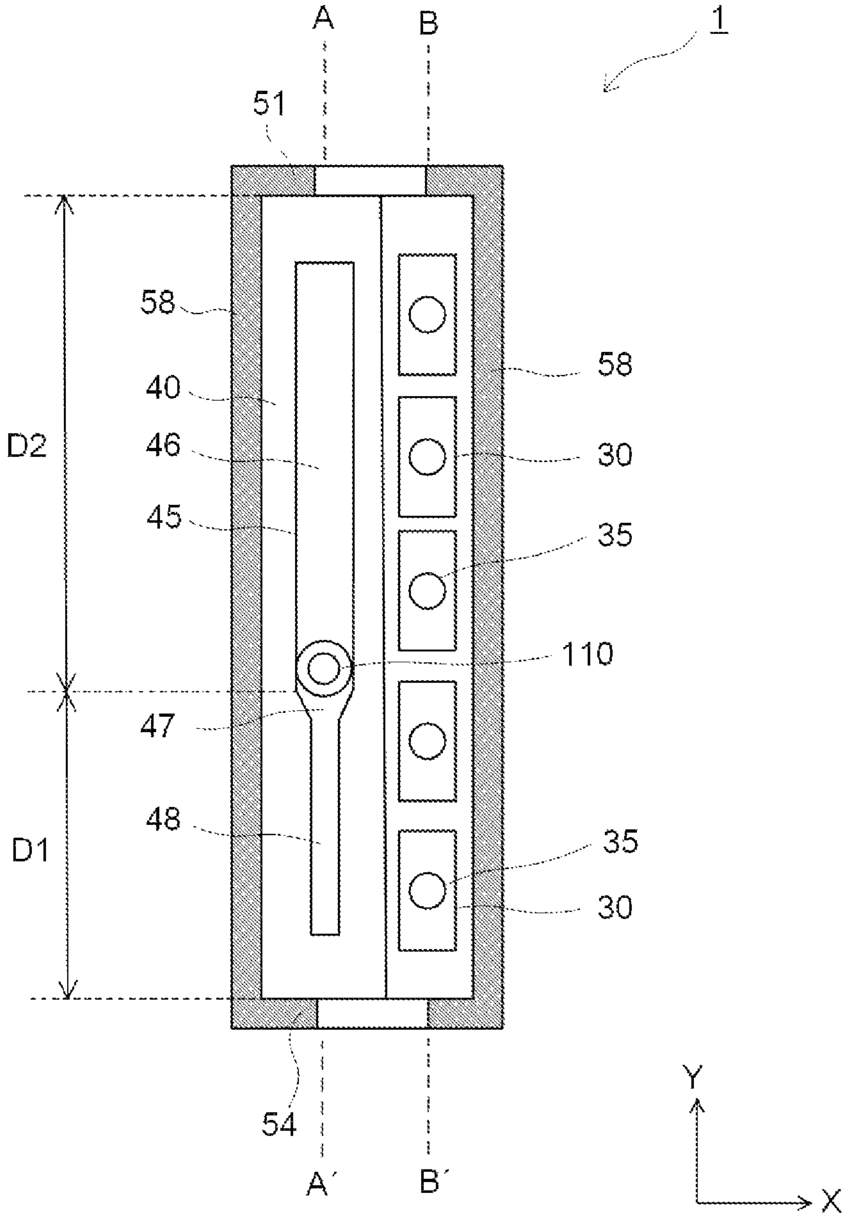
Figure 4:
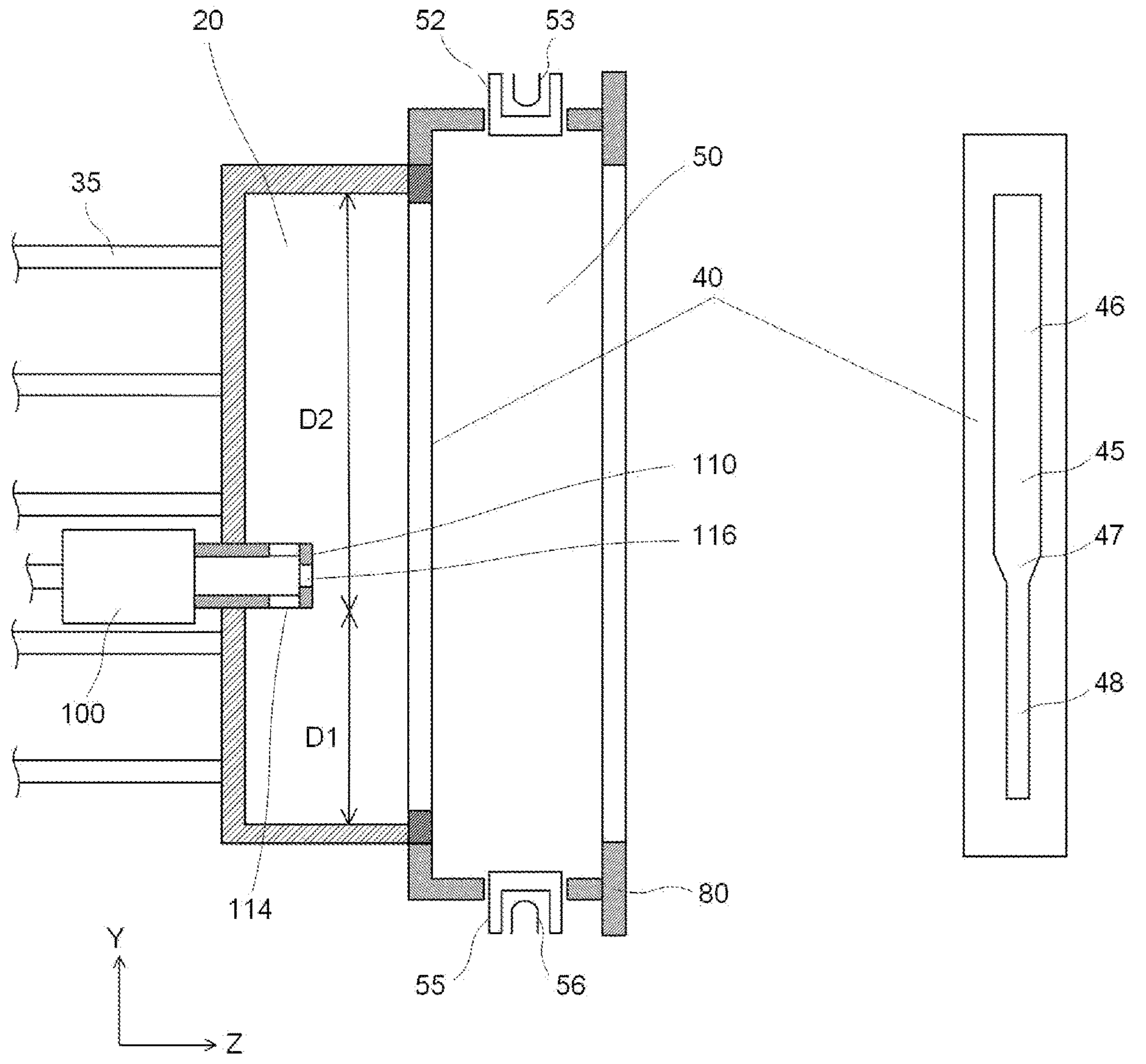
Figure 5:
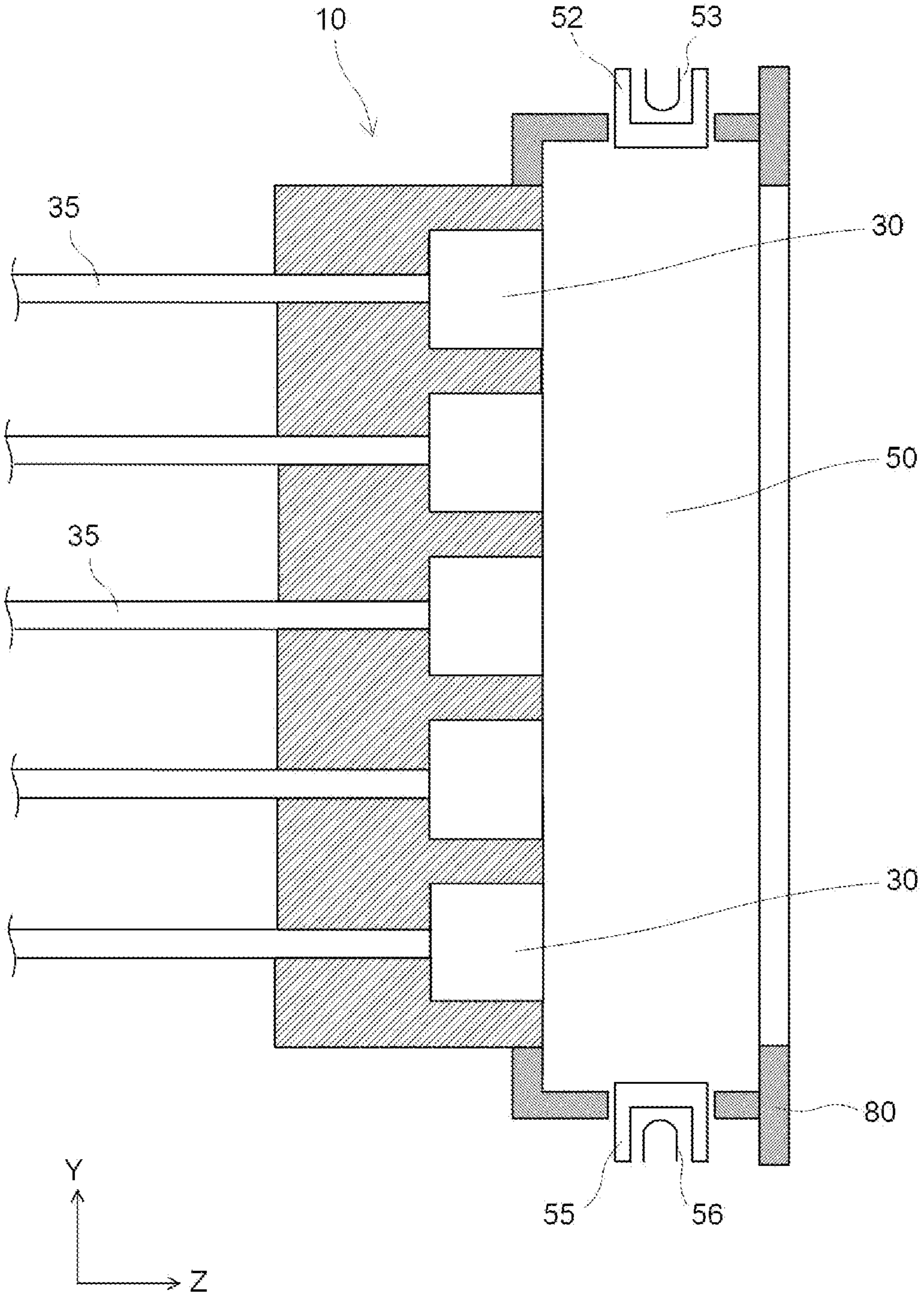

FIGS. 3-5 illustrate the ion source 1, according to some embodiments, in which FIG. 3 illustrates the ion source 1 when viewed from a Z-axis direction with the extraction plate 80 removed, FIG. 4 illustrates a cross-sectional view of the ion source 1 taken along A-A' in FIG. 3, and FIG. 5 illustrates a cross-sectional view of the ion source 1 taken along B-B' in FIG. 3. In FIGS. 3-5, like reference designators represent like components in FIG. 2 that have like structure and functions, and therefore a repeated description thereof is omitted for conciseness.

As illustrated in FIGS. 3-5, in an embodiment, the plenum 10 includes the plurality of gas feed chambers 30, each having a corresponding gas feed line 35. In other words, the plurality of gas feed lines 35 feed gases respectively into corresponding ones of the plurality of gas feed chambers 30. The gas feed lines 35 feed various gases into the ionization chamber 50 for generating the plasma in the ionization chamber 50. For example, in some embodiments, the gases may include tungsten fluoride (WF6), hydrogen (H2) co-gas, boron trifluoride (BF3), arsine (AsH3), phosphine (PH3), a noble gas such as Argon, Helium and Xenon and/or chlorine (Cl2), etc. However, these are only examples and, in some embodiments, any gas suitable for generating plasma may be used.

In an embodiment, the ion source 1 includes a vaporizer 100 for generating the vapor, and a nozzle 110 for introducing the vapor into the plenum chamber 20. The vaporizer 100 may be, for example, a vaporizer as described in U.S. application Ser. No. 18/585,499, filed Feb. 23, 2024, and titled "VAPORIZER AND ION SOURCE"; U.S. patent application Ser. No. 17/714,491, filed Apr. 6, 2022, now U.S. Patent Application Publication No. 2023/326702 for "VAPORIZER, ION SOURCE AND METHOD FOR GENERATING ALUMINUM-CONTAINING VAPOR"; or U.S. patent application Ser. No. 17/945,705, filed Sep. 15, 2022 for "VAPORIZER, ION SOURCE AND METHOD FOR GENERATING ALUMINUM-CONTAINING VAPOR", the entire contents of each of these U.S. patent applications being herein incorporated by reference in their entireties. In some embodiments, the vaporizer 100 may generate the vapor from a solid raw material. For example, in some embodiments, the solid raw material may be aluminum (Al). However, this is only an example and, in some embodiments, other solid raw materials may be used depending on the vapor used to generate the plasma for extracting the ion beam. In some embodiments, the vaporizer 100 may generate the vapor from antinomy (Sb), sulfur(S) containing compounds, InI3, InCl3, WCl4, Al2O3, AlCl3, Ti (Titanium), Ni (Nickel), or molybdenum disulfide (MoS2) alone or in combination with one or more gasses. However, these are only examples and, in some embodiments, the vaporizer 100 may generate the vapor from other materials and/or gasses.

An interior of the vaporizer 100 may be in fluid communication with the interior of the plenum chamber 20 through the nozzle 110. The nozzle 110 of the vaporizer extends through a wall the plenum chamber 20 that is opposite from the plenum plate 40 in the Z-axis direction, and thus a distal portion of the nozzle 110 may extend into the plenum chamber 20.

In the ion source 1 illustrated in FIGS. 3-5, an odd number of the plurality of gas feed chambers 30 are included in the ion source 1. In this case, the vaporizer 100 is offset from the center of the wall of the plenum chamber 20 in the Y-axis direction. The vaporizer 100 may be offset from the center to allow for the gas feed lines 35 to be uniformly spaced along the longitudinal direction (e.g., the Y-axis direction). In other words, the vaporizer 100 may be offset so as not to conflict with one of the gas feed lines 35.

In some embodiments, the ion source 1 may include five gas feed chambers 30 and five gas feed lines 35 as illustrated in FIGS. 3-5. In this case, the vaporizer 100 may be disposed such that two gas feed lines 35 are disposed below the vaporizer 100 and three gas feed lines 35 are disposed above the vaporizer 100 in the Y-axis direction.

The slit 45 of the plenum plate 40 has a geometry based on the location of the nozzle 110 of the vaporizer 100 in the wall of the plenum chamber 20 in the longitudinal direction (e.g., the Y-axis direction). In an embodiment, the slit 45 may include a top portion 46, a transition portion 47, and a bottom portion 48. The top portion 46 has a width in the X-axis direction that is wider than a width of the bottom portion 48 in the X-axis direction. A width of the transition portion 47 in the X-axis direction gradually narrows from the top portion 46 to the bottom portion 48. A location of the nozzle 110 of the vaporizer 100 in the wall of the plenum chamber 20 in the longitudinal direction generally coincides with a location of the transition portion 47 in the slit 45 in the longitudinal direction. In an embodiment, a bottom of the nozzle 110 may be located at a position in the wall of the plenum chamber 20 in the longitudinal direction that corresponds to a top of the transition portion in the longitudinal direction (best seen in FIG. 3). In an embodiment, a distance D1 of the bottom of the nozzle 110 of the vaporizer 100 from a bottom wall of the plenum chamber 20 may correspond to a combined length of the bottom portion 48 and the transition portion 47 of the slit 45 in the Y-axis direction. In an embodiment, a distance D2 of the bottom of the nozzle 110 from a top wall of the plenum chamber 20 may correspond to a distance from the top wall of the plenum chamber 20 to a bottom of the transition portion 47 of the slit 45 in the Y-axis direction. Since the location of the vaporizer 100 is offset from a center of the plenum chamber 20 in the Y-axis direction, the distance D2 from the top wall of the plenum chamber 20 is greater than the distance D1.

In an embodiment, the length in the longitudinal direction of the portion of the slit 45 that has the narrower width may be shorter than a length in the longitudinal direction of the portion of the slit 45 that has the wider width. Thus, assuming a case in which the vaporizer 100 is disposed so as to be offset in the direction of the top wall of the plenum chamber 20 such that two gas feed lines 35 are disposed on top of the vaporizer 100 and three gas feed lines are disposed on the bottom of the vaporizer 100 (i.e., opposite to the example illustrated in FIGS. 3-5), the top portion 46 of the slit 45 would have a narrower width that the bottom portion 48 of the slit 45 (again opposite to the example illustrated in FIGS. 3-5) and the width of the transition portion 47 would gradually decrease from the bottom portion 48 to the top portion 46 (i.e., in the opposite direction to that illustrated in FIGS. 3-5). This configuration is due to the volume of the plenum chamber 20 being less on the side to which the vaporizer 100 is offset such that the portion of the plenum plate 40 with the narrower slit restricts the flow of vapor into the ionization chamber 50 more than the portion of the plenum plate 40 with the wider slit in order that the vapor flows more uniformly into the ionization chamber 50. With the flow of a more uniform vapor along the longitudinal (e.g., the Y-axis direction) into the ionization chamber 50, a more uniform plasma may be generated in the ionization chamber 50 and thus a more uniform ribbon ion beam IB may be extracted from the ionization chamber 50.

Figure 6:
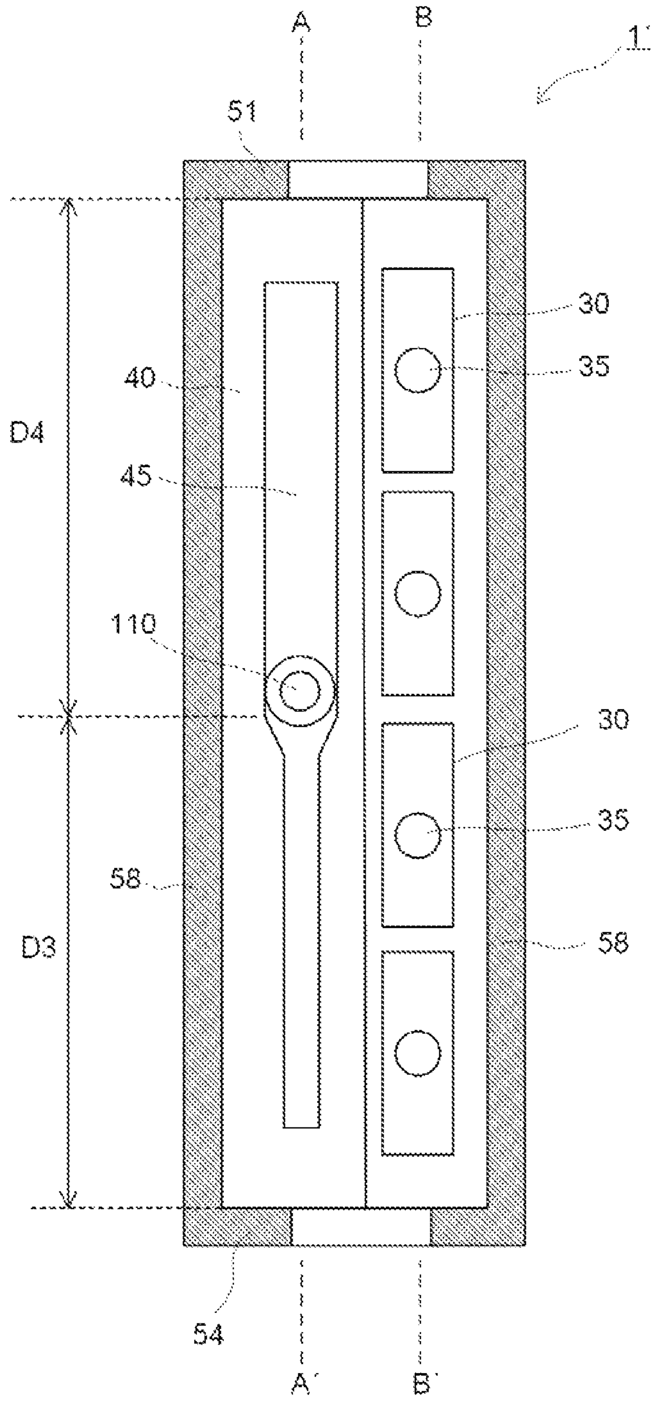
Figure 7:
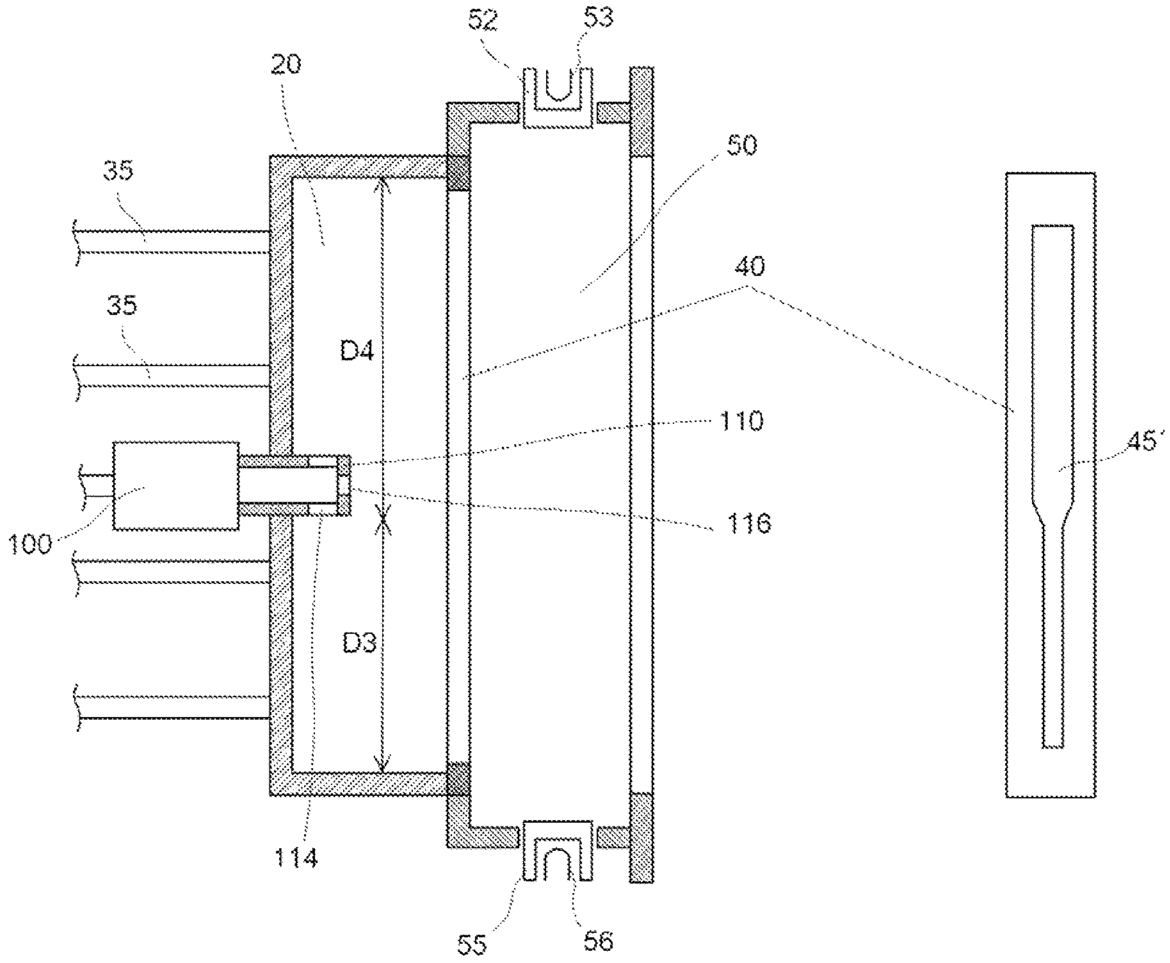
Figure 8:
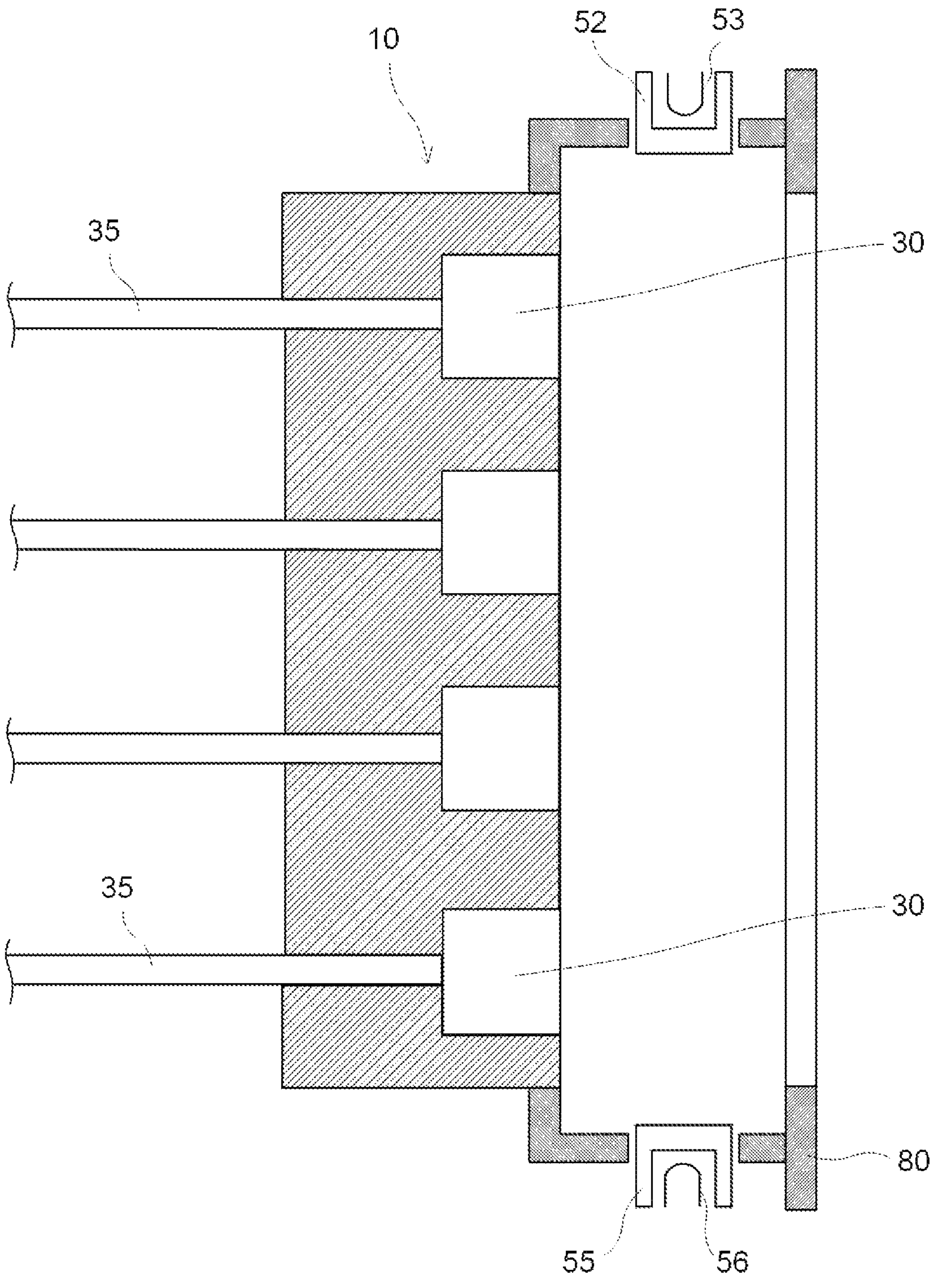

FIGS. 6-8 illustrate a ion source 1', according to some embodiments, in which FIG. 6 illustrates the ion source 1' when viewed from a Z-axis direction, FIG. 7 illustrates a cross-sectional view of the ion source 1' taken along A-A' in FIG. 6, and FIG. 8 illustrates a cross-sectional view of the ion source 1' taken along B-B' in FIG. 6. In FIGS. 6-8, like reference designators represent like components in FIGS. 2-5 that have like structures and functions, and therefore a repeated description thereof is omitted for conciseness.

FIGS. 6-8 illustrate an example in which the plurality of gas feed chambers 30 and the plurality of gas feed lines 35 are each provided in an even number. In this configuration, the vaporizer 100 may be disposed to feed vapor into the plenum chamber 20 at the center of the wall of the plenum chamber 20. For example, FIGS. 6-8 illustrate an example of the ion source 1' in which four gas feed chambers 30 and four gas feed lines 35 are provided and two of the gas feed lines 35 are positioned above the vaporizer 100 and two of the gas feed lines 35 are positioned below the vaporizer 100. In this case, the nozzle 110 of the vaporizer 100 may be located in the center of the wall of the plenum chamber 20 in the Y-axis direction.

In an embodiment, similar to the example illustrated in FIGS. 3-5, a location of the nozzle 110 of the vaporizer 100 in the wall of the plenum chamber 20 in the longitudinal direction may generally coincide with a location of the transition portion 47 in the longitudinal direction of the slit 45. In an embodiment, a distance D3 of the bottom of the nozzle 110 of the vaporizer 100 from a bottom wall of the plenum chamber 20 may correspond to a combined length of the bottom portion 48 and the transition portion 47 of the slit 45 in the Y-axis direction. In an embodiment, a distance D4 of the bottom of the nozzle 110 from a top wall of the plenum chamber 20 may correspond to a distance from the top wall of the plenum chamber 20 to a bottom of the transition portion 47 of the slit 45 in the Y-axis direction. While, in this example, the location of the vaporizer 100 is at the center of the plenum chamber 20 in the Y-axis direction, the bottom of the nozzle 110 is located below the center and thus the distance D4 from a top wall of the plenum chamber 20 is still greater than the distance D3.

Figure 9:
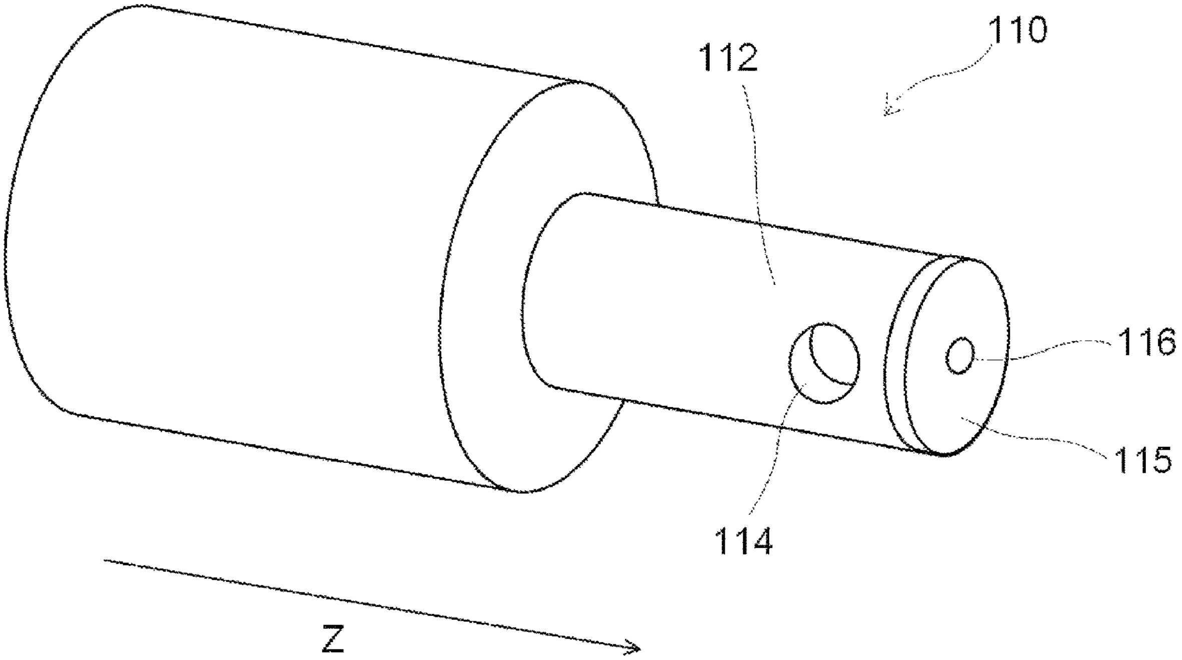
FIG. 9 illustrates an example of a nozzle of a vaporizer of the ion source, according to some embodiments.

FIG. 9 illustrates an example of a nozzle of a vaporizer of the ion source 1 or the ion source 1', according to some embodiments. The nozzle 110 may include a pipe 112 and a cap 115 on a distal end of the pipe 112. The pipe 112 may have a plurality of holes 114 formed therein at the distal end of the pipe 112. In an embodiment, two holes 114 may be provided as illustrated in FIG. 9. However, this number is only an example and, in some embodiments, more than two holes 114 may be formed.

In an embodiment, the two holes 114 may be located on opposite sides of the pipe 112. The holes 114 may be located on lateral sides of the pipe 112 (e.g., in the X-axis direction) as illustrated in FIG. 9. However, this location is only an example and, in some embodiments, the holes 114 may be formed in the top and bottom of the pipe 112 (e.g., in the Y-axis direction) (see, e.g., FIG. 4). For example, when the holes 114 are located on the top and bottom of the pipe 112, the vapor may more easily spread out along a longitudinal direction (e.g., the Y-axis direction) in the plenum chamber 20. In an embodiment, a diameter of each of the plurality of holes 114 may be the same. The cap 115 may have a hole 116 formed therein (i.e., in the Z-axis direction). In an embodiment, the diameter of the hole 116 may be smaller than a diameter of each of the holes 114.

In an embodiment, the pipe 112 may extend through the wall of the plenum chamber 20 as described above. As such, a distal portion of the pipe 112 may extend into the plenum chamber 20. In use, a vapor generated from a solid raw material in a crucible (not shown) of the vaporizer 100 may travel through the pipe 112 into the plenum chamber 20 and flow out of the holes 114 and the hole 116 into the plenum chamber 20.

Figure 10:
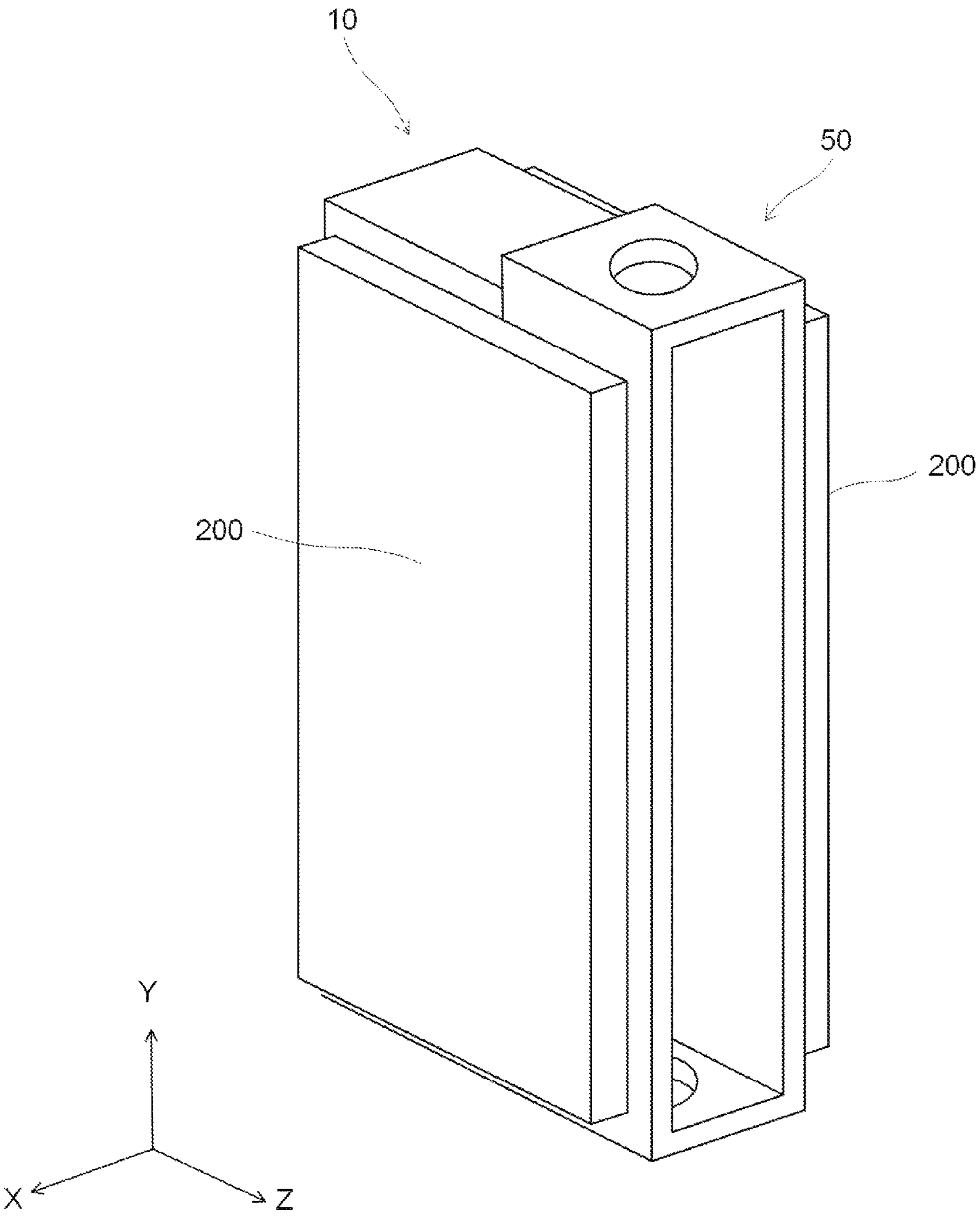
FIG. 10 illustrates an example of a heater of the ion source, according to some embodiments.

FIG. 10 illustrates an example of a heater of the ion source, according to some embodiments. In an embodiment, a heater 200 may be provided on lateral side surfaces of the plenum 10 and the ionization chamber 50. In an embodiment, the heater 200 may be a block heater as illustrated in FIG. 10. However, embodiments are not limited thereto and, in some embodiments, the heater 200 may be a coil heater. A heater density of the heater 200 at a top and bottom thereof is different than a heater density of the heater 200 at a middle thereof. In other words, the middle of the heater 200 may generate a higher heating temperature than the top and bottom of the heater 200. This is because the cathode 52 and the cathode 55 are provided at the top and the bottom of the ionization chamber 50 and the cathode 52 and the cathode 55 each generate heat. Therefore, for uniform heating, it is not needed to heat the top and bottom ends of the plenum 10 and the ionization chamber 50 as much because the cathode 52 and the cathode 55 provide their own heat. In other words, the heater 200 ensures a uniform temperature of the ionization chamber 50.

In use, the heater 200 helps mitigate condensation of the vapor supplied by the vaporizer 100. For example, in an embodiment, the temperature of the ion source 1 or the ion source 1' may be very low in comparison with a related art ion source that is used for manufacturing semiconductor devices. As an example, the ion source 1 or the ion source 1' having a height of about 370 mm to 400 mm and a width of about 60 mm may have a temperature during operation of about 100° C. to about 400° C. By contrast, the related art ion source that is used for manufacturing semiconductor device may have a height of about 130 mm to 160 mm and a width of about 60 mm and may have a temperature during operation of about 1000° C. to about 1500° C. The size of the ionization chamber is only one factor that may determine the temperature of the ionization chamber. Other factors may include, for example, an operation method of the ion source, a structure of the cathode in the ionization chamber, etc.

In some embodiments, the heater 200 may be omitted from the lateral side surfaces of the ionization chamber 50 and the heater 200 may only be provided on the lateral side surfaces of the plenum 10. For example, when a temperature of the ionization chamber 50 is higher than a condensation temperature of the vapor, the heater 200 may be omitted from the lateral side surfaces of the ionization chamber 50.

In some embodiments, the heater 200 may be omitted entirely. For example, when the plenum 10 is heated by heat transfer from the ionization chamber 50 and when the temperature of the plenum 10 is higher than the condensation temperature of the vapor, the heater 200 may be omitted from the ion source 1 or the ion source 1'.

Figure 11:
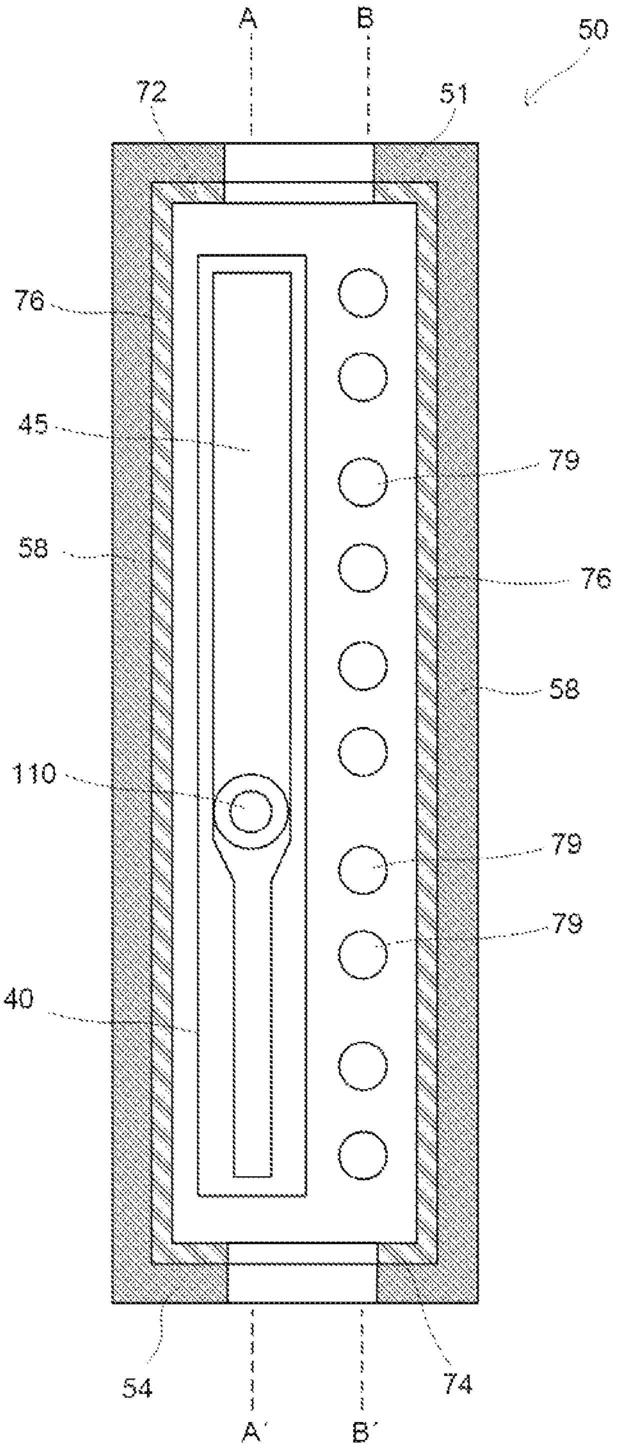
Figure 12:
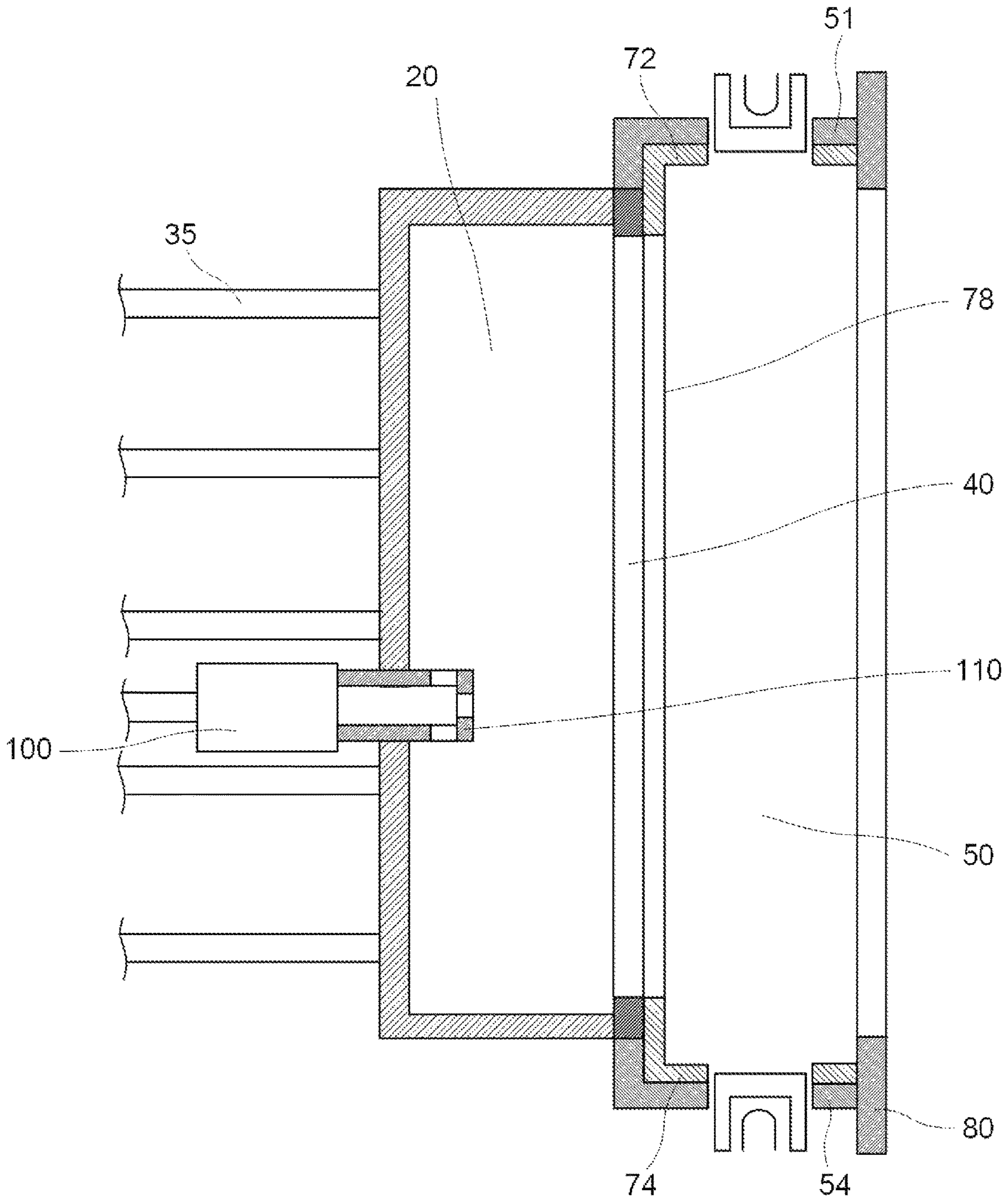
Figure 13:
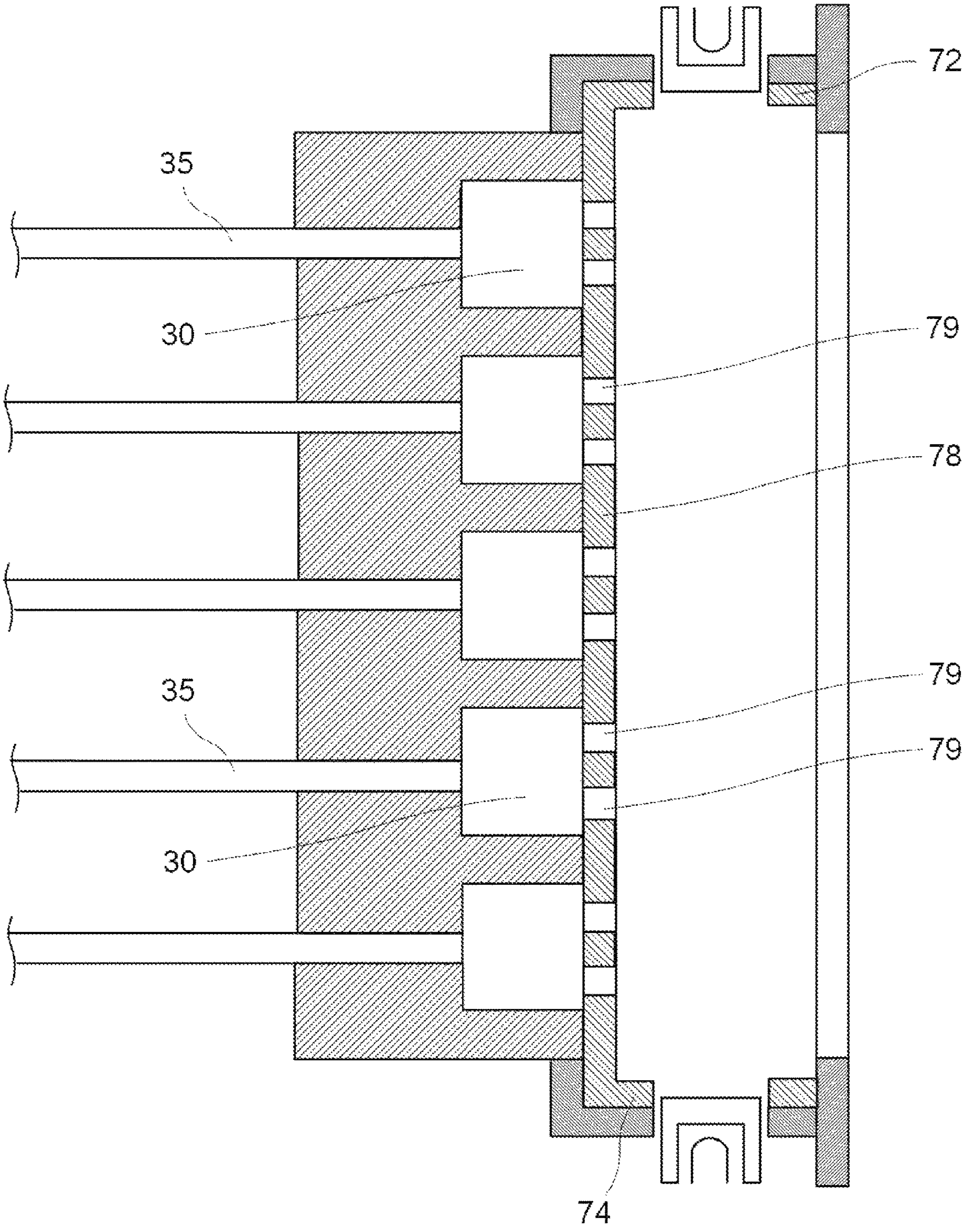

FIGS. 11-13 illustrate a liner of the ion source, according to some embodiments, in which FIG. 11 illustrates the liner when viewed from a Z-axis direction in FIG. 2, FIG. 12 illustrates a cross-sectional view of the liner taken along A-A' in FIG. 11, and FIG. 13 illustrates a cross-sectional view of the liner taken along B-B' in FIG. 11.

As described above, in some embodiments, interior walls of the ionization chamber 50 may be covered by the liner 70. In some embodiments, the liner 70 may include the top liner 72, the bottom liner 74, the two side wall liners 76, and the rear liner 78.

As illustrated in FIG. 11, the rear liner 78 may be formed with an opening corresponding to the plenum plate 40 and a plurality of openings 79 for the plurality of gas feed chambers 30. In the example illustrated in FIGS. 11-13, each gas feed chamber 30 is provided with two openings 79 (best seen in FIG. 13). However, embodiments are not limited thereto and, in some embodiments, the rear liner 78 may have one opening 79 or more than two openings 79 for each of the gas feed chambers 30.

In an embodiment, the top liner 72, the bottom liner 74, the two side wall liners 76, and the rear liner 78 may be formed as one single liner 70. However, embodiments are not limited thereto and, in some embodiments, separate liners may be provided.

In an embodiment, the top liner 72, the bottom liner 74, the two side wall liners 76, and the rear liner 78 may each be made of molybdenum. However, this is only an example and, in some embodiments, the top liner 72, the bottom liner 74, the two side wall liners 76, and the rear liner 78 may be made of other materials as long as the material will decrease sputtering onto the walls of the ionization chamber 50.

In some embodiments, the liner 70 may be omitted.

Figure 14:
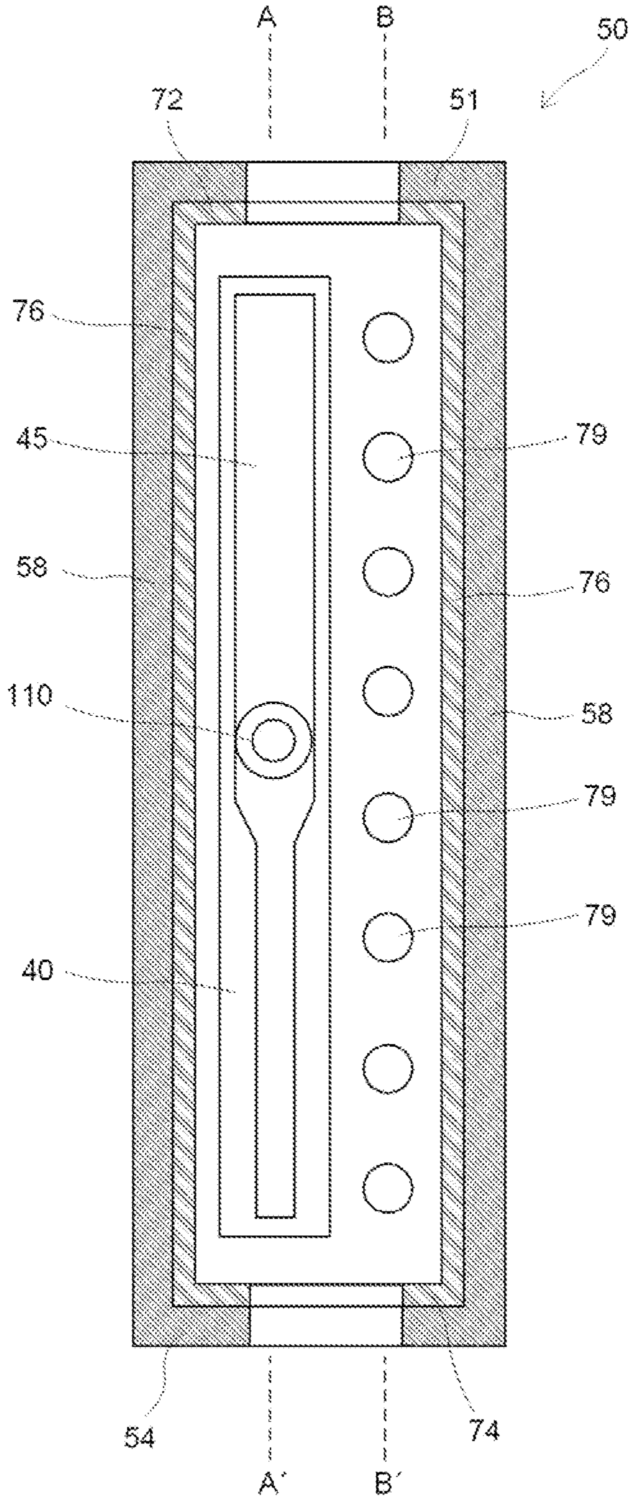
Figure 15:
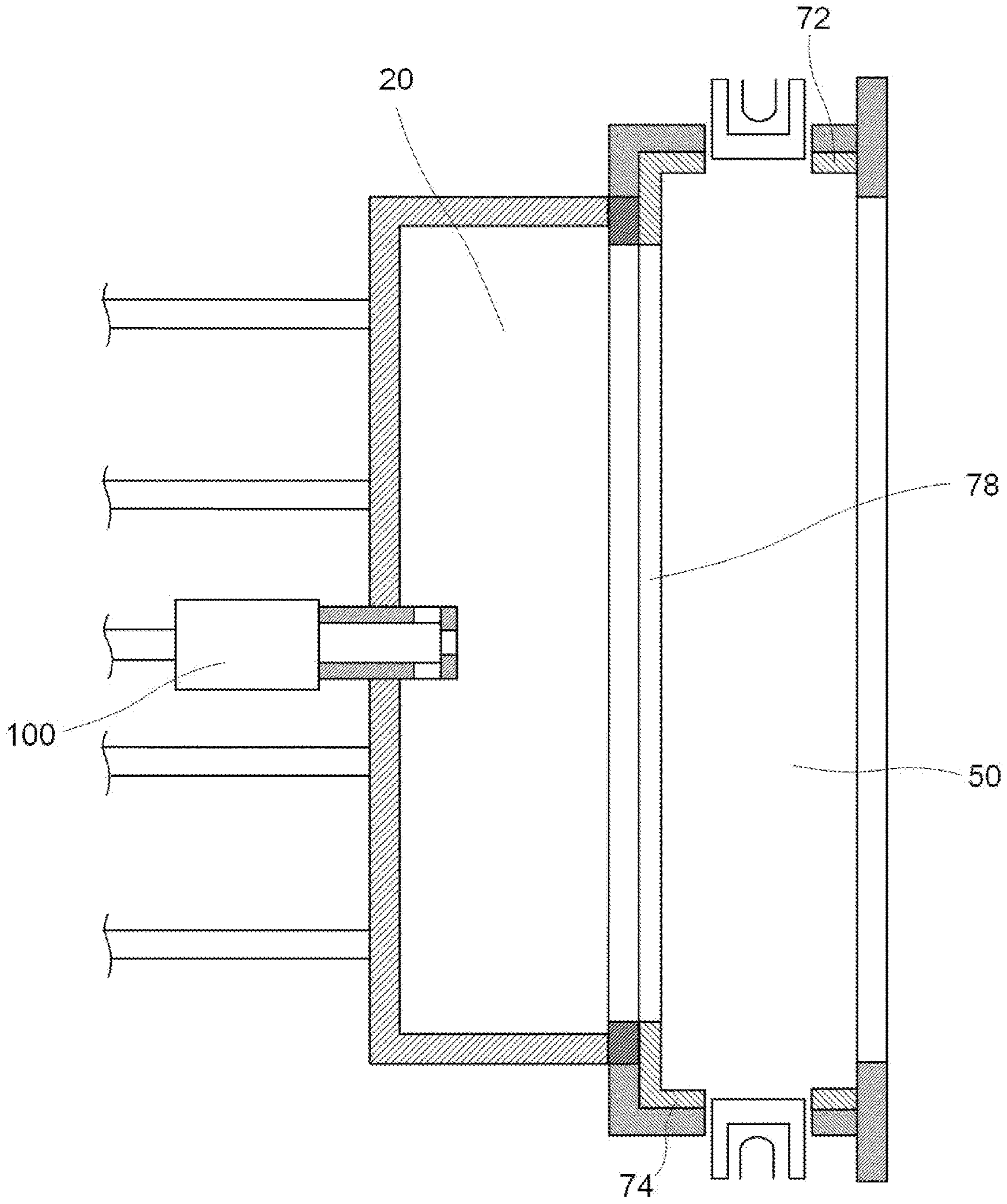
Figure 16:
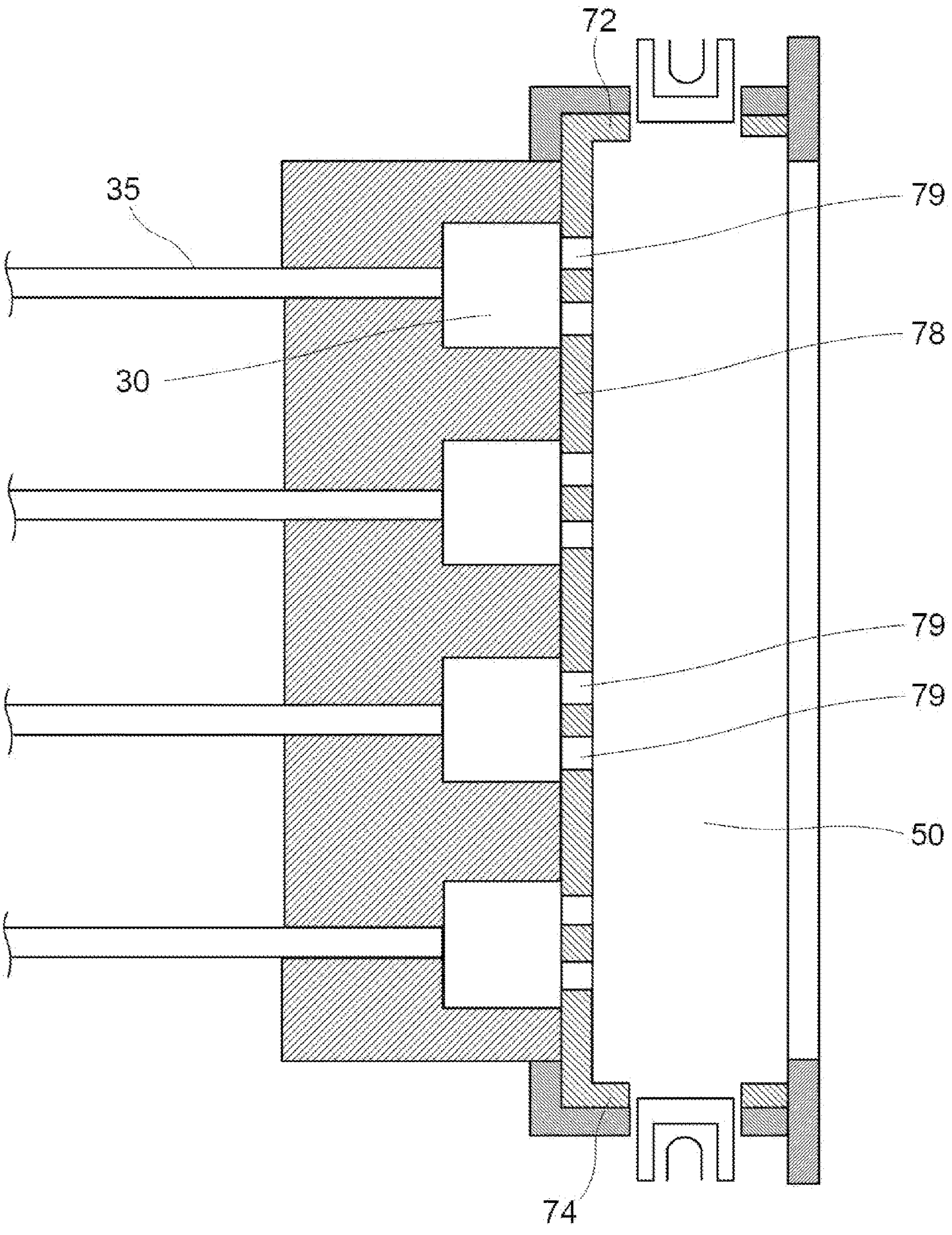

FIGS. 14-16 illustrate a liner of the ion source, according to some embodiments, in which FIG. 14 illustrates the liner when viewed from a Z-axis direction in FIG. 2, FIG. 15 illustrates a cross-sectional view of the liner taken along A-A' in FIG. 14, and FIG. 16 illustrates a cross-sectional view of the liner taken along B-B' in FIG. 14. FIGS. 14-16 correspond to FIGS. 13-15 and thus repeated description thereof is omitted for conciseness.

In FIGS. 14-16, an example of the liner 70 as applied to the ion source 1' of FIGS. 6-8 is illustrated. As with the example illustrated in FIGS. 11-13, the rear liner 78 may include a plurality of openings 79 for the plurality of gas feed chambers 30. In the example illustrated in FIGS. 14-16, each gas feed chamber 30 is provided with two openings 79 (best seen in FIG. 16). However, embodiments are not limited thereto and, in some embodiments, the rear liner 78 may have one opening 79 or more than two openings 79 for each of the gas feed chambers 30.

It should be understood that embodiments are not limited to the various embodiments described above, but various other changes and modifications may be made therein without departing from the spirit and scope thereof as set forth in appended claims.

What is claimed is:

1. An ion source comprising:

a vaporizer configured to produce a vapor from a solid raw material;

a plenum comprising a plenum chamber having a first wall through which the vaporizer is in fluid communication with an interior of the plenum chamber, and a second wall opposite the first wall, the second wall comprising a plenum plate with a slit therein.

2. The ion source according to claim 1, further comprising an ionization chamber in fluid communication with the plenum chamber, the ionization chamber being secured to the plenum at a proximal end of the ionization chamber.

3. The ion source according to claim 2, further comprising a heater that heats the plenum and the ionization chamber.

4. The ion source according to claim 2, further comprising a liner that covers an interior surface of walls of the ionization chamber.

5. The ion source according to claim 4, wherein the walls of the ionization chamber comprise graphite or carbon.

6. The ion source according to claim 4, wherein the liner comprises molybdenum.

7. The ion source according to claim 1, wherein the plenum further comprises a plurality of gas feed chambers respectively coupled to a plurality of gas feed lines, the plurality of gas feed chambers being in fluid communication with an interior of an ionization chamber.

8. The ion source according to claim 7, wherein a number of the plurality of gas feed chambers is four or five.

9. The ion source according to claim 1, wherein the vaporizer comprises a nozzle that extends through the first wall into the interior of the plenum chamber.

10. The ion source according to claim 9, wherein the nozzle comprises a pipe that extends into the interior of the plenum chamber, and a cap that covers a distal end of the pipe, wherein the pipe comprises two holes in opposite sides of the pipe, each of the two holes having a first diameter, and the cap comprises a single hole having a second diameter smaller than the first diameter.

11. The ion source according to claim 9, wherein:

the slit has a first portion having a first width, a second portion having a second width, and a transition portion having a width that gradually changes from the first width to the second width, and a location of the nozzle in the first wall of the plenum chamber in a longitudinal direction coincides with a location of the transition portion in the slit in the longitudinal direction.

12. The ion source according to claim 1, wherein:

the plenum chamber comprises a top wall and a bottom wall, the vaporizer is disposed at a position closer to the bottom wall than to the top wall, the slit has a first portion having a first width and a second portion having a second width that is less than the first width, the second portion is closer to the bottom wall than to the top wall, and the slit narrows from the first portion to the second portion at a position corresponding to the position of the vaporizer.

13. The ion source according to claim 1, wherein:

the plenum chamber comprises a top wall and a bottom wall, the vaporizer is disposed at a position closer to the top wall than to the bottom wall, the slit has a first portion having a first width and a second portion having a second width that is greater than the first width, the first portion is closer to the top wall than to the bottom wall, and the slit narrows from the second portion to the first portion at a position corresponding to the position of the vaporizer.

14. An ion implanter comprising:

a process chamber including a target holder;

the ion source according to claim 1; and a plurality of extraction electrodes configured to extract an ion beam from the ion source to implant ions on a target removably disposed on the target holder.

15. An ion source comprising:

a vaporizer comprising a nozzle;

a plenum comprising:

a plenum chamber having a first wall through which the nozzle of the vaporizer extends, and a second wall opposite the first wall, the second wall comprising a plenum plate with a longitudinal aperture therein, and a plurality of gas feed chambers coupled to a plurality of gas feed lines; and an ionization chamber which is in fluid communication with both to the plenum chamber through the longitudinal aperture and to the plurality of gas feed chambers, the ionization chamber being secured to the plenum at a proximal end of the ionization chamber.

16. The ion source according to claim 15, wherein a number of the plurality of gas feed chambers is four or five.

17. The ion source according to claim 15, further comprising a heater that heats the plenum and the ionization chamber.

18. The ion source according to claim 15, further comprising a liner that covers an interior surface of walls of the ionization chamber.

19. The ion source according to claim 18, wherein the walls of the ionization chamber comprise graphite or carbon.

20. The ion source according to claim 18, wherein the liner comprises molybdenum.

* * * * *